(12) United States Patent
Pillay Narrainen et al.

(10) Patent No.: US 9,663,710 B2
(45) Date of Patent: May 30, 2017

(54) QUANTUM DOT COMPOSITIONS

(71) Applicant: Nanoco Technologies, Ltd., Manchester (GB)

(72) Inventors: Amilcar Pillay Narrainen, Manchester (GB); Cong-Duan Vo, Manchester (GB); Khai Duong Quang Nguyen, Manchester (GB); Imad Naasani, Manchester (GB)

(73) Assignee: Nanoco Technologies Inc., Manchester (GB)

( * ) Notice: Subject to any disclaimer, the term of this patent is extended or adjusted under 35 U.S.C. 154(b) by 210 days.

(21) Appl. No.: 14/661,768

(22) Filed: Mar. 18, 2015

(65) Prior Publication Data
US 2015/0267106 A1  Sep. 24, 2015

Related U.S. Application Data

(60) Provisional application No. 61/954,860, filed on Mar. 18, 2014.

(51) Int. Cl.
*C09K 11/02*  (2006.01)
*H01L 33/50*  (2010.01)
*H01L 33/56*  (2010.01)
*C09K 11/88*  (2006.01)
*B82Y 20/00*  (2011.01)

(52) U.S. Cl.
CPC ............ *C09K 11/025* (2013.01); *C09K 11/02* (2013.01); *C09K 11/883* (2013.01); *H01L 33/502* (2013.01); *H01L 33/56* (2013.01); *B82Y 20/00* (2013.01); *Y10S 977/774* (2013.01); *Y10S 977/779* (2013.01); *Y10S 977/95* (2013.01)

(58) Field of Classification Search
CPC ..... C09K 11/025; H10L 33/502; H10L 33/56; Y10S 997/774; Y10S 997/779; Y10S 997/95; B82Y 20/00
See application file for complete search history.

(56) References Cited

U.S. PATENT DOCUMENTS

| 7,374,807 | B2* | 5/2008 | Parce | B82Y 20/00 252/301.4 R |
| 7,598,314 | B2* | 10/2009 | Lee | C08G 77/22 524/268 |
| 7,964,279 | B2* | 6/2011 | Kim | C08G 77/458 428/403 |
| 8,283,412 | B2* | 10/2012 | Liu | B82Y 30/00 524/588 |
| 2012/0025239 | A1* | 2/2012 | Kim | C07F 7/0854 257/98 |
| 2014/0022779 | A1 | 1/2014 | Su et al. | |

FOREIGN PATENT DOCUMENTS

| EP | 2584623 A2 | 4/2013 |
| WO | 2013093631 A2 | 6/2013 |
| WO | 2013114254 A2 | 8/2013 |
| WO | WO 2013/114254 * | 8/2013 |

* cited by examiner

*Primary Examiner* — Carol M Koslow
(74) *Attorney, Agent, or Firm* — Blank Rome, LLP

(57) ABSTRACT

It has been discovered that certain silicon-containing, surface-modifying ligands can be used to make semiconductor nanoparticles (quantum dots) more compatible with polysiloxanes. Quantum dots dispersed in a polysiloxane matrix may be used, for example, in light-emitting devices to alter the emission spectrum of such devices.

13 Claims, 4 Drawing Sheets

US 9,663,710 B2

QUANTUM DOT COMPOSITIONS

CROSS-REFERENCE TO RELATED APPLICATIONS

Figure 1:
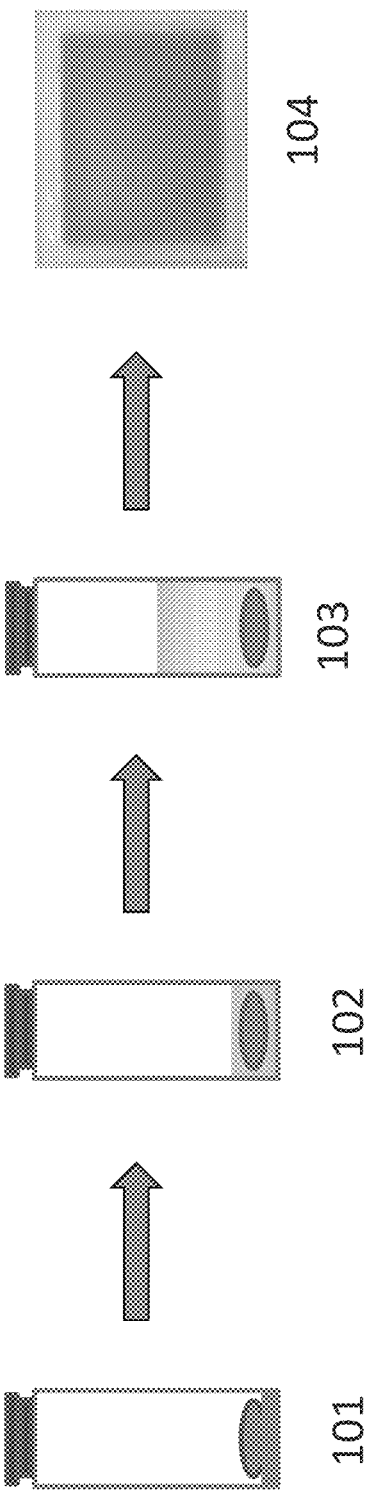

This application claims the benefit of U.S. Provisional Application No. 61/954,860 filed on Mar. 18, 2014, the entire contents of which are hereby incorporated by reference.

STATEMENT REGARDING FEDERALLY SPONSORED RESEARCH OR DEVELOPMENT

Not Applicable

BACKGROUND OF THE INVENTION

1. Field of the Invention

The present invention generally relates to materials comprising light-emitting semiconductor quantum dots (QDs). More particularly, it relates to silicone-based polymers incorporating QDs.

2. Description of the Related Art Including Information Disclosed Under 37 CFR 1.97 and 1.98

Light-emitting diodes (LEDs) are becoming more important in everyday life and it is envisaged that they will become one of the major applications in many forms of lighting such as automobile lights, traffic signals, general lighting, liquid crystal display (LCD) backlighting and display screens. Currently, LED devices are typically made from inorganic solid-state compound semiconductors, such as AlGaAs (red), AlGaInP (orange-yellow-green), and AlGaInN (green-blue). However, using a mixture of the available solid-state compound semiconductors, solid-state LEDs that emit white light cannot be produced. Moreover, it is difficult to produce "pure" colors by mixing solid-state LEDs of different frequencies. Therefore, the main, current method of color mixing to produce a required color, including white, is to use a combination of phosphorescent materials that are placed on top of the solid-state LED whereby the light from the LED (the "primary light") is absorbed by the phosphorescent material and then re-emitted at a different frequency (the "secondary light"), i.e., the phosphorescent materials down convert the primary light to the secondary light. Moreover, the use of white LEDs produced by phosphor down-conversion leads to lower cost and simpler device fabrication than a combination of solid-state red-green-blue LEDs.

Current phosphorescent materials used in down converting applications absorb UV or mainly blue light and convert it to longer wavelengths, with most phosphors currently using trivalent rare-earth doped oxides or halophosphates. White emission can be obtained by blending phosphors that emit in the blue, green and red regions with that of a blue- or UV-emitting solid-state device. i.e., a blue light-emitting LED plus a green phosphor such as, $SrGa_2S_4:Eu^{2+}$, and a red phosphor such as, $SrSiEu^{2+}$ or a UV light-emitting LED plus a yellow phosphor such as, $Sr_2P_2O_7:Eu^{2+}$; $Mn^{+2}$ and a blue-green phosphor. White LEDs can also be made by combining a blue LED with a yellow phosphor, however, color control and color rendering may be poor when using this methodology due to lack of tunability of the LEDs and the phosphor. Moreover, conventional LED phosphor technology uses down converting materials that have poor color rendering (i.e., color rendering index (CRI)<75).

There has been substantial interest in exploiting the properties of compound semiconductors consisting of particles with dimensions on the order of 2-50 nm, often referred to as quantum dots (QDs) or nanocrystals. These materials are of commercial interest due to their size-tuneable electronic properties that can be exploited in many commercial applications such as optical and electronic devices and other applications, including biological labeling, photovoltaics, catalysis, biological imaging, LEDs, general space lighting and electroluminescent displays, amongst many new and emerging applications.

The most studied of semiconductor materials have been the chalcogenides II-VI materials namely ZnS, ZnSe, CdS, CdSe, CdTe; most noticeably CdSe due to its tuneability over the visible region of the spectrum. Reproducible methods for the large scale production of these materials have been developed from "bottom up" techniques, whereby particles are prepared atom-by-atom, i.e., from molecules to clusters to particles, using "wet" chemical procedures.

Two fundamental factors, both related to the size of the individual semiconductor nanoparticle, are responsible for their unique properties. The first is the large surface-to-volume ratio; as a particle becomes smaller, the ratio of the number of surface atoms to those in the interior increases. This leads to the surface properties playing an important role in the overall properties of the material. The second factor is, with many materials including semiconductor nanoparticles, there is a change in the electronic properties of the material with size, moreover, because of quantum confinement effects the band gap gradually becomes larger as the size of the particle decreases. This effect is a consequence of the so-called confinement of an "electron in a box" giving rise to discrete energy levels similar to those observed in atoms and molecules, rather than a continuous band as observed in the corresponding bulk semiconductor material. Thus, for a semiconductor nanoparticle, because of the physical parameters, the "electron and hole", produced by the absorption of electromagnetic radiation, a photon, with energy greater than the first excitonic transition, are closer together than they would be in the corresponding macro-crystalline material. Moreover, the Coulombic interaction cannot be neglected. This leads to a narrow bandwidth emission that depends upon the particle size and composition of the nanoparticle material. Thus, quantum dots have higher kinetic energy than the corresponding macro-crystalline material and consequently the first excitonic transition (band gap) increases in energy with decreasing particle diameter.

Core semiconductor nanoparticles that consist of a single semiconductor material along with an outer organic passivating layer tend to have relatively low quantum efficiencies due to electron-hole recombination occurring at defects and dangling bonds situated on the nanoparticle surface that may lead to non-radiative electron-hole recombinations. One method to eliminate defects and dangling bonds on the inorganic surface of the quantum dot is to grow a second inorganic material, having a wider band-gap and small lattice mismatch to that of the core material epitaxially on the surface of the core particle, to produce a "core-shell" particle. Core-shell particles separate any carriers confined in the core from surface states that would otherwise act as non-radiative recombination centers. One example is a ZnS shell grown on the surface of a CdSe core.

It will be appreciated from the foregoing discussion that many of the QD materials that have been extensively studied to date incorporate cadmium ions. There are, however, many environmental problems associated with the use of cadmium and other heavy metals such as mercury- and lead-based materials and thus there is a need to develop cadmium-free nanoparticle materials. In particular, it is desirable to produce non-cadmium containing quantum dots that exhibit similar monodispersities and size-tuneable photoluminescent spectra to current cadmium based materials. Commercial needs also dictate that such materials should be produced in high yields on a large-scale, as inexpensively as possible.

Rudimentary, quantum dot-based, light-emitting devices have been made by embedding colloidally produced quantum dots in an optically clear LED encapsulation medium, typically a silicone or an acrylate, which is then placed on top of a solid-state LED. The use of quantum dots potentially has certain significant advantages over the use of the more conventional phosphors, such as the ability to tune the emission wavelength, strong absorption properties, and low scattering (if the quantum dots are mono-dispersed).

For the commercial application of quantum dots in next-generation light-emitting devices, the quantum dots are preferably incorporated into the LED encapsulating material while remaining as fully mono-dispersed as possible and without significant loss of quantum efficiency. The methods developed to date are problematic, not least because of the nature of current LED encapsulants. Quantum dots can agglomerate when formulated into current LED encapsulants thereby reducing the optical performance of the quantum dots. Moreover, once the quantum dots are incorporated into the LED encapsulant, oxygen can migrate through the encapsulant to the surfaces of the quantum dots, which can lead to photo-oxidation and, as a result, a drop in quantum yield (QY).

One way of addressing the problem of oxygen migration to the QDs has been to incorporate the QDs into a medium with low oxygen permeability, such as a polymer. Polymers incorporating QDs can be used to make films or to make beads, which can be incorporated into light-emitting devices. However, QDs are not compatible with all polymer systems. In particular, cadmium-free QDs are difficult to match with compatible polymer systems. For example, incompatible polymer systems may react with QDs, causing the QY of the QD to decrease. Also, QDs tend to agglomerate in many polymer systems, causing the QY to decrease. To date, polymers based on acrylate monomers, such as methacrylates, have been found to be the most compatible with QDs. However, most acrylate systems are somewhat permeable to oxygen, and for that reason, are less than ideal. Also, acrylate polymers are subject to degradation by high temperatures, ultraviolet radiation, and oxidation.

BRIEF SUMMARY OF THE INVENTION

Quantum dots (QDs) often agglomerate when formulated into current LED encapsulants. This reduces the optical performance of the quantum dots. Oxygen that migrates through the encapsulant to the surfaces of the quantum dots can lead to photo-oxidation of the quantum dots and, as a result, a drop in quantum yield (QY). Most acrylate polymer systems are at least somewhat permeable to oxygen. Also, acrylate polymers tend to degrade at high temperatures and when exposed to ultraviolet radiation and oxidizing agents.

Polysiloxanes (inorganic, silicon-based polymers) have excellent resistance to heat, UV radiation and oxidation. An example of a polysiloxane is polydimethylsiloxane (PDMS). Several functional groups such as acrylate and epoxy may also be incorporated in polysiloxanes, providing flexibility to make cross-linked films having many desirable properties. Unfortunately, QDs generally disperse poorly in most polysiloxanes. As a result, films and other structures made with QDs dispersed in polysiloxanes exhibit less than ideal QY.

It has been discovered that certain silicon-containing, surface-modifying ligands can be used to make QDs more compatible with polysiloxanes. QDs dispersed in a polysiloxane matrix may be used, for example, in light-emitting devices to alter the emission spectrum of such devices.

BRIEF DESCRIPTION OF THE SEVERAL VIEWS OF THE DRAWING(S)

FIG. 1 is a schematic illustration of a process for making polyalkylsiloxane-modified QDs, according to an embodiment of the invention.

Figure 2:

FIG. 2 contains photographs of quantum dots in viscous polydimethylsiloxane resin without additional surface ligand (top left vial) and with surface ligand (top right vial) and their corresponding films after curing at 50° C. for 24 hours under nitrogen.

Figure 3:
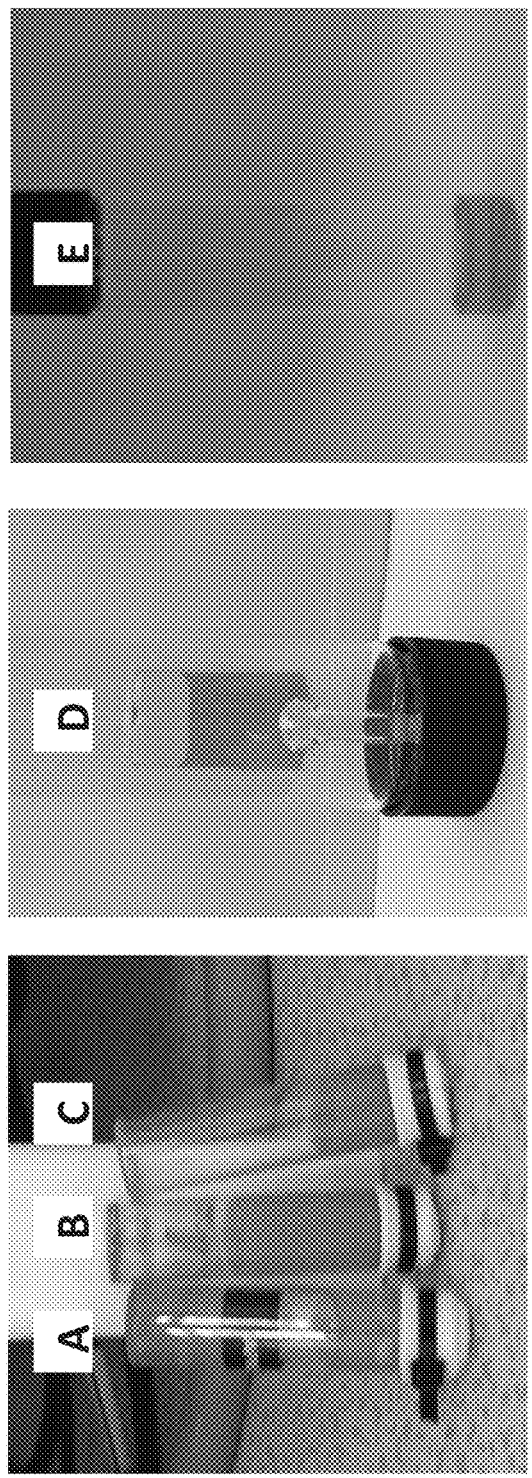
Figure 4:
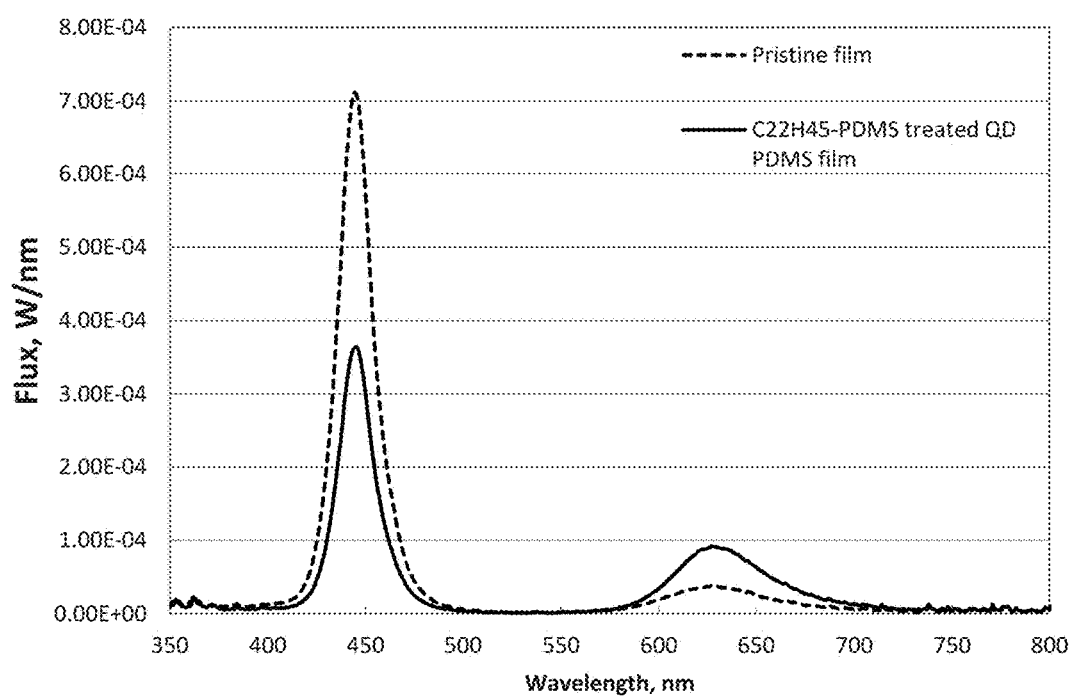

FIG. 3 shows dispersions of QDs in low viscosity polydimethylsiloxane with and without using additional surface ligands according to the invention FIG. 4 shows spectra of pristine (dashed line) and $C_{22}H_{45}$-polydimethyl-siloxane-treated (solid line) QD/crosslinked polydimethylsiloxane films.

DETAILED DESCRIPTION OF THE INVENTION

Inorganic, silicon-based polymers, referred to as polysiloxanes, are often used for high performance coatings due to their excellent resistance to heat, UV radiation and oxidation. An example of a polysiloxane is polydimethylsiloxane (PDMS available as SYLGARD® 184, DOW CORNING CORPORATION 2200 WEST SALZBURG ROAD MIDLAND MICHIGAN 48686). Several functional groups such as acrylate and epoxy can be incorporated in the polysiloxanes, providing flexibility to make cross-linked films and having other desired properties (e.g., high solids/low volatile organic compounds, good weatherability, excellent resistance to corrosion). Polysiloxanes may provide a cost-effective alternative to traditional organic coatings. Unfortunately, QDs generally disperse poorly in most polysiloxanes because the prior art surface ligands often used on the QDs are generally not compatible with the polysiloxane matrix. As a result, films and other structures made of QDs dispersed in polysiloxanes exhibit less than ideal QYs.

It has been discovered that silicon-containing surface-modifying ligands can be used to render QDs more compatible with polysiloxanes. The silicon-containing surface-modifying ligands can be represented by structures 1-3:

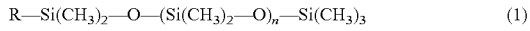
R—Si(CH$_3$)$_2$—O—(Si(CH$_3$)$_2$—O)$_n$—Si(CH$_3$)$_3$     (1)

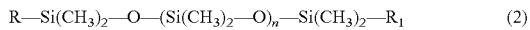
R—Si(CH$_3$)$_2$—O—(Si(CH$_3$)$_2$—O)$_n$—Si(CH$_3$)$_2$—R$_1$     (2)

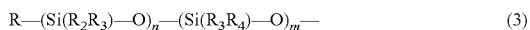
R—(Si(R$_2$R$_3$)—O)$_n$—(Si(R$_3$R$_4$)—O)$_m$—     (3)

Where n is an integer ranging from 2 to 30 and m is an integer, and R, R$_1$, R$_2$, R$_3$, and R$_4$ are aliphatic groups, with or without end-functionality. For example, one or more of R, R$_1$, R$_2$, R$_3$, and R$_4$ can be substituted with a functional group that chemically binds to the surface of QDs. Examples of such functional groups include thiols, carboxylates, and amines. According to certain embodiments, any of R—R$_4$ can be a substituted or unsubstituted (—CH$_2$)$_x$CH$_3$ chain.

The number of repeating units, x, can be from 2 to 30, 2 to 20, 2 to 10, or 2 to 5, for example.

Examples of suitable silicon-containing surface-modifying ligands are HOOC—$(CH_2)_{10}$—$Si(CH_3)_2$—O—$(Si(CH_3)_2$—O$)_y$—$Si(CH_3)_2$—$C_4H_9$ and HOOC—$C_{18}H_{36}$-PDMS (both available from Gelest, Inc., Morrisville, Pa.). Other suitable silicon-containing surface-modifying ligands according to structures 1-3 may be synthesized by techniques familiar to those skilled in the art. For example, esterification of a carboxylated polysiloxane with an aliphatic alcohol may be used to obtain aliphatic-substituted polysiloxanes. Alcohols, such as $CH_3(CH_2)_n$—$CH_2OH$, tert-butanol, and isoborneol may be used to make different aliphatic-terminated polysiloxanes useful as surface-modifier ligands. Example 1 below describes the preparation of such a ligand by the esterification reaction between a carboxy-terminated PDMS and lauryl alcohol.

FIG. 1 illustrates a procedure for preparing polysiloxane-based films of QDs, as described herein. According to the procedure illustrated in FIG. 1, polysiloxane ligand prepared as described above is added to a container 101. The polysiloxane ligand will typically be a liquid, and can be added to the container neat or in a suitable solvent. The container can be a vial or flask, for example. It may be beneficial to purge the container with inert gas, such as $N_2$. QDs can then be added to the container 102. The present disclosure is not limited to any specific types of QDs. However, due to their sensitivity, cadmium-free QDs benefit particularly from the methods disclosed herein. Examples of cadmium free QDs include QDs based on alloys of In, P, Zn, and S available from Nanoco Technologies Ltd. (Manchester U.K.) under the CFQD® trademark.

A person of skill in the art will appreciate that, in many cases, the coordination about the final inorganic surface atoms in any core, core/shell or core/multishell, doped or graded QD is typically incomplete, with highly reactive, non-fully coordinated atoms acting as "dangling bonds" on the surface of the particle, which can lead to particle agglomeration. This problem is typically overcome by passivating (capping) the "bare" surface atoms with protecting organic groups ("capping agents"). The capping agent may be the solvent in which the nanoparticles have been prepared or may be added to the reaction mixture in which the QDs are prepared. Ligands of this kind include, but are not limited to, mono- or multi-dentate ligands such as phosphines (trioctylphosphine, triphenylphosphine, t-butylphosphine, etc.), phosphine oxides (trioctylphosphine oxide, triphenylphosphine oxide, etc.), alkyl phosphonic acids, alkyl-amines (hexadecylamine, octylamine, etc.), aryl-amines, pyridines, long chain fatty acids and thiophenes.

When QDs are mixed with the silicon-containing surface-modifying ligands disclosed herein, those ligands adhere to the surface of the QDs in one of two general modes. The first mode in which the silicon-containing surface-modifying ligands may adhere to the QD surface is by ligand exchange, whereby the silicon-containing surface-modifying ligands replace some of the capping agent molecules already present on the QD surface. This mode of adhesion is particularly favored for silicon-containing surface-modifying ligands that contain a surface-binding species, such as a thiol. The second mode is by intercalation of the silicon-containing, surface-modifying ligands within the sheath formed by the capping agent molecules already present on the surface of the QD.

Once the surfaces of the QDs have been modified using the silicon-containing surface-modifying ligands, the QDs may be mixed with a silicon-containing polymer 103. Examples of suitable silicon-containing polymers include PDMS, such as SYLGARD 184, available from Dow Corning. A crosslinker and/or hardener may be added also and the mixture mixed thoroughly. The polymer/QD mixture may then be used to make films, beads, or any other polymer-based geometry 104. Method of forming films or beads will be apparent to those of skill in the art. For example, spin coating, drop coating, evaporative coating, printing, doctor blading, etc. may be used. Films may be cured at elevated temperatures, for example 50° C., or as otherwise known in the art.

As shown in the examples below, when films are QDs are modified with silicon-containing ligands, the QDs disperse much more readily in silicones and yield better, and more consistent, films.

Example 1: Synthesis of Aliphatic-Terminated Polydimethylsiloxane Surface Ligands Monocarboxy-terminated PDMS (10 g, 6.67 mmol) was added to a three-neck, round-bottom flask equipped with a cooling tower and stirrer. Lauryl alcohol (1.49 g, 8 mmol) was then added to the flask under nitrogen and the mixture was dissolved in dichloromethane (DCM, 180 mL). Dicyclohexylcarbodiimide (DCCI) (1.376 g, 6.67 mmol) and pyrrolidino pyridine (99.8 mg, 0.667 mmol) were then added and the mixture was stirred under nitrogen overnight. The mixture was then refluxed using a 50° C. water bath for 6 hours before being washed with deionized water (3×250 mL). The organic phase was then dried with $Na_2SO_4$ and DCM was removed under low pressure. The liquid so obtained was washed with methanol and then re-dissolved in hexane before the insoluble part in hexane solution was removed by filtration. Finally, the hexane removed under vacuum affording 6.89 g clear liquid.

Example 2: Films of QDs in PDMS Resin

Red-emitting core/shell QDs having a core containing In, P, Zn, and S and having a shell based on ZnS were prepared as disclosed in U.S. Pat. No. 7,867,556, the entire contents of which are incorporated herein by reference. A visual comparison of the QDs in viscous PDMS resin (SYLGARD184, Dow Corning) without additional surface ligand and with surface ligand and their corresponding films after curing at 50° C. for 24 hours under nitrogen showed that the surface ligand ($C_{22}H_{45}$-PDMS) obtained by above-described esterification reaction clearly improved the dispersion of the red quantum dots in the PDMS resin and film.

FIG. 3 illustrates the poor non-homogeneous dispersions of red QDs in low viscosity, unfunctionalized PDMS without additional surface ligands (A-C), a homogeneous dispersion of red QDs after treating with a liquid functionalized polysiloxane (D) and a homogeneous dispersion of (D) in low viscosity unfunctionalized PDMS showing the use of a functionalized polysiloxane to improve dispersion in unfunctionalized polysiloxanes; (A) QDs that were dried and mixed with PDMS; (B) QDs that were dried before addition of PDMS solution in toluene and mixing; (C) a QD dispersion in toluene that was mixed with low viscosity PDMS in toluene (heating at 50° C. did not improve this dispersion); (D) a good dispersion of red QDs in mercapto-functional silicone after mixing the QDs toluene dispersion with 4-6 mole % mercaptopropyl methylsiloxane-dimethylsiloxane copolymer with heating at 50° C. under nitrogen for 48-60 hours and toluene removed using high vacuum; (E) a clear solution of QD obtained when (D) was diluted and mixed with low viscosity, unfunctionalized PDMS.

FIG. 4 shows spectra obtained using a LABSPHERE® integrating sphere (LABSPHERE INC. 231 Shaker Street NORTH SUTTON NEW HAMPSHIRE 03260) of pristine (dashed line) and $C_{22}H_{45}$-PDMS-treated (solid line) cadmium-free QD/cross-linked PDMS (SYLGARD 184) films. It is clear that the ratio of the emission peak area to the excitation peak area of the $C_{22}H_{45}$-PDMS-treated cadmium-free QD film is higher than that of the pristine cadmium-free QD film which is in agreement with the fact that the treated cadmium-free quantum dots dispersed better in the PDMS. The QE of pristine (dashed line) and $C_{22}H_{45}$-PDMS-treated (solid line) cadmium-free QD/crosslinked PDMS films were 38 and 52% respectively.

TABLE 1

Quantum yield of the pristine and surface ligand-treated red QD in silicone oils or films (QDs in PDMS (ca. 12 mg/1 mL resin)).

| Sample-QD in: | QY Solution | QY Film | Appearance |
|---|---|---|---|
| Toluene | 70 | — | Transparent homogeneous distribution. |
| HOOC—$C_{10}H_{21}$-PDMS-$C_4H_9$ | 38 | — | QD partly aggregated. |
| SYLGARD 184 | 62 | 54 | QD aggregation. |
| HOOC—$C_{18}H_{37}$-PDMS-treated QDs in SYLGARD 184 | 62 | 55 | Opaque/ homogeneous distribution. |
| $C_{22}H_{45}$-PDMS-treated QDs in SYLGARD 184 | 63 | 59 | Opaque/ homogeneous distribution. |
| MPMS-PDMS treated QDs (not diluted in low viscosity PDMS) | 55 | — | Transparent/ homogeneous distribution. |

Notes:
HOOCC$_{10}$H$_{21}$-PDMS-C$_4$H$_9$ is an abbreviation for monocarboxy-terminated polydimethylsiloxane (HOOC—(CH$_2$)$_{10}$—Si(CH$_3$)$_2$—O—((Si)$_2$—Si(CH$_3$)$_2$—C$_4$H$_9$, viscosity = 20 cps) available from ABCR GmbH (76187 Karlsruhe, Germany);
C$_{18}$H$_{37}$-PDMS is an abbreviation for octadecyl-terminated polydimethylsiloxane (ABCR);
C$_{22}$H$_{45}$-DMS is an abbreviation for the ligand obtained from esterification reaction of HOOCC$_{10}$H$_{21}$-PDMS-C$_4$H$_9$ with lauryl alcohol and MPMS-PDMS is an abbreviation for 4-6 mole % mercaptopropyl methylsiloxane-dimethylsiloxane copolymer (from ABCR GmbH).
The QD/PDMS films were typically cured at 50° C. for 24 hours in a nitrogen atmosphere.

The embodiments disclosed herein provide the following advantages: they provide an alternative way to prepare QD/polymer films or QD dispersions in silicone oils for display and lighting applications with comparable performance and new properties; QD polysiloxane films are as flexible as films prepared using lauryl methacrylate (LMA) as a monomer and trimethyloyl propane trimethacrylate (TMPTM) as a cross-linker and the polysiloxane film's matrix is more stable against heat, UV, corrosion and oxidation; and there are fewer environmental and health-related issues since polysiloxanes have high solid content, low VOC and low toxicity compared to traditional polymeric materials obtained from (meth)acrylates and polyurethanes.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. A composition comprising:
   at least one quantum dot comprising a semiconductor material;
   surface ligands disposed on the surface of the quantum dot, the surface ligand comprising a polysiloxane; and
   a capping agent disposed on the surface of the quantum dot, the capping agent selected from the group consisting of phosphines, phosphine oxides, alkyl phosphonic acids, alkyl-amines, aryl-amines, pyridines, long chain fatty acids and thiophenes.

2. The composition recited in claim 1 wherein the polysiloxane has a formula selected from the group consisting of:

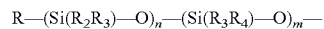

where n and m are integers and R, $R_1$, $R_2$, $R_3$, and $R_4$ are aliphatic groups.

3. The composition recited in claim 2 wherein at least one of R, $R_1$, $R_2$, $R_3$, and $R_4$ are substituted with a functional group that chemically binds to the surface of the quantum dot.

4. The composition recited in claim 3 wherein the functional group is selected from the group consisting of thiols, carboxylates, and amines.

5. The composition recited in claim 2 wherein at least one of R, $R_1$, $R_2$, $R_3$, and $R_4$ is a substituted (—CH$_2$)$_x$CH$_3$ chain, wherein x is 2 to 30.

6. The composition recited in claim 2 wherein at least one of R, $R_1$, $R_2$, $R_3$, and $R_4$ is an unsubstituted (—CH$_2$)$_x$CH$_3$ chain, wherein x is 2 to 30.

7. The composition recited in claim 2 wherein the number of repeating units, n, is 2 to 30.

8. The composition recited in claim 1 wherein the quantum dot is a cadmium-free quantum dot.

9. The composition recited in claim 1 wherein the surface ligands comprise compounds having the chemical formula: HOOC—(CH$_2$)$_{10}$—Si(CH$_3$)$_2$—O—(Si(CH$_3$)$_2$—O)$_y$—Si(CH$_3$)$_2$—C$_4$H$_9$, wherein y is an integer.

10. The composition recited in claim 1 wherein the surface ligands comprise compounds having the chemical formula: HOOC—C$_{18}$H$_{36}$-PDMS where PDMS is polydimethylsiloxane.

11. A lighting device comprising a light-emitting diode (LED) encapsulated in a matrix, the matrix comprising:
    a polysiloxane; and
    a composition dispersed in the polysiloxane, the composition comprising:
       at least one quantum dot comprising a semiconductor material;
       surface ligands disposed on the surface of the quantum dot, the surface ligand comprising a polysiloxane; and
       a capping agent disposed on the surface of the quantum dot, the capping agent selected from the group consisting of phosphines, phosphine oxides, alkyl phosphonic acids, alkyl-amines, aryl-amines, pyridines, long chain fatty acids and thiophene.

12. A polymer film comprising a polymer polysiloxane matrix having dispersed therein a composition, the composition comprising:
    at least one quantum dot comprising a semiconductor material;
    surface ligands disposed on the surface of the quantum dot, the surface ligand comprising a polysiloxane; and
    a capping agent disposed on the surface of the quantum dot, the capping agent selected from the group consisting of: phosphines, phosphine oxides, alkyl phosphonic acids, alkyl-amines, aryl-amines, pyridines, long chain fatty acids and thiophene.

13. A polymer bead comprising a polysiloxane matrix having dispersed therein a composition comprising:
at least one quantum dot comprising a semiconductor material;
surface ligands disposed on the surface of the quantum dot, the surface ligand comprising a polysiloxane; and
a capping agent disposed on the surface of the quantum dot, the capping agent selected from the group consisting of: phosphines, phosphine oxides, alkyl phosphonic acids, alkyl-amines, aryl-amines, pyridines, long chain fatty acids and thiophene.

* * * * *